United States Patent
Tseng et al.

(10) Patent No.: US 7,521,266 B2
(45) Date of Patent: Apr. 21, 2009

(54) PRODUCTION AND PACKAGING CONTROL FOR REPAIRED INTEGRATED CIRCUITS

(75) Inventors: Shu-Jung Tseng, Tai-Chung (TW); Chi Chang Su, Hsin-Chu (TW); Chien-Wu Chu, Taoyuan (TW); You-Wen Yau, Taipei (TW); Long Sheng Yeou, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 434 days.

(21) Appl. No.: 11/413,468

(22) Filed: Apr. 28, 2006

(65) Prior Publication Data

US 2007/0111402 A1   May 17, 2007

Related U.S. Application Data

(60) Provisional application No. 60/737,286, filed on Nov. 16, 2005.

(51) Int. Cl.
*H01L 21/66* (2006.01)
*G01R 31/26* (2006.01)

(52) U.S. Cl. ............... 438/14; 438/281; 438/333; 438/E21.521; 438/E21.592

(58) Field of Classification Search .......... 438/14, 438/15, 18, 132, 281, 601, 765, E21.521, 438/E21.524, E21.592
See application file for complete search history.

(56) References Cited

U.S. PATENT DOCUMENTS

| 6,153,043 | A |   | 11/2000 | Edelstein et al. |
| 6,162,686 | A | * | 12/2000 | Huang et al. ............... 438/281 |
| 6,376,345 | B1 |  | 4/2002 | Ohashi et al. |
| 6,787,484 | B2 |  | 9/2004 | Yao et al. |

* cited by examiner

*Primary Examiner*—Hoai V Pham
(74) *Attorney, Agent, or Firm*—Slater & Matsil, L.L.P.

(57) ABSTRACT

A method for reducing the scrap rate of fuse structures after laser repairing is provided. The method includes providing a semiconductor wafer comprising integrated circuits, performing a yield test on the semiconductor wafer to determine defective circuits, predetermining a wavelength limit, and keeping the semiconductor wafer away from lights having wavelengths lower than the wavelength limit. The defects on the semiconductors wafer are repaired by burning laser fuses. For copper-based fuse structures, the wavelength limit is about 550 nm.

19 Claims, 4 Drawing Sheets

PRODUCTION AND PACKAGING CONTROL FOR REPAIRED INTEGRATED CIRCUITS

This application claims priority to provisional patent application Ser. No. 60/737,286, filed Nov. 16, 2005, entitled "Robust Production Control and Packing Method for 12" Cu Fuse Device," which application is hereby incorporated herein by reference.

TECHNICAL FIELD

This invention relates generally to process control in the production and packaging of integrated circuits, and more particularly to the quality control of laser repaired semiconductor wafers.

BACKGROUND

A typical integrated circuit may include millions of devices or sub circuits. Some of the integrated circuits contain numerous identical sub circuits. For example, a memory chip may contain millions of identical memory cells, and even if only one memory cell has defects, the entire chip may be rendered defective.

To increase yield, redundant memory cells are manufactured on the same chip. If some of the primary memory cells have defects, redundant memory cells can be used to replace the defective primary memory cells. This redundant configuration permits the semiconductor memory device to continue to operate in a normal state. The primary memory cells and redundant memory cells are all connected via fuses controlled by control circuits on the chip. As stated above, if a defective memory cell is discovered, a fuse coupled to the defective memory cell is blown and the redundant memory cell is connected instead. Accordingly, the semiconductor chip with defective primary memory cells can operate normally. This methodology is also used on other integrated circuits, particularly circuits having multiple identical units.

Highly integrated semiconductor memory devices have a fairly high manufacturing cost, which causes a significant loss if any defective cells are discovered. Types of fuses deployed in such semiconductor memory devices include electrical fuses selectively cut by the flow of excessive current and laser fuses selectively cut by an applied laser beam. In contemporary systems, laser fuses are widely used due to their simplicity in use and layout. Electrical fuses are commonly used in semiconductor memory devices such as electrically erasable programmable read only memory (EEPROM) while the laser fuses are very often used in dynamic random access memory (DRAM).

FIG. 1 illustrates a conventional laser fuse structure. A laser fuse 100 is formed close to the top surface of the chip. Through layers of metal islands 112 and vias 104, the laser fuse 100 is connected to two conductive lines 106, which are in turn connected to integrated circuits. By etching and opening a fuse window 118, a thin passivation layer 122 is left, and laser fuse 100 can be broken by a laser. An open circuit is formed between the conductive lines 106. A redundant circuit will then replace the malfunctioning circuit. The fuse structure is typically protected by a protection ring 116. Typically, multiple fuses are formed, connecting to multiple redundant circuits.

The laser fuse components 100, 112 and 104 are typically formed of conductive material like copper or aluminum. For a period of time after the laser burning and before packaging, copper is exposed. Copper is prone to corrosion from detrimental chemical elements such as fluorine, chlorine, sulfur, and the like. These detrimental chemicals may come from ambient environment, from which integrated circuits are fabricated, or from the wafer container, or even from other processes performed after the fabrication. Corrosion may result in the degradation of the repaired integrated circuits. A scrap rate, which measures a percentage of the wafers that become defective again after repairing, may reach as high as 26 percent in certain circumstances, thus the production yield is significantly reduced.

Therefore, what is needed is a method for eliminating/reducing fuse corrosion and for decreasing the scrap rate.

SUMMARY OF THE INVENTION

In accordance with one aspect of the present invention, a method for manufacturing integrated circuits includes providing a substrate comprising integrated circuits, performing a yield test on the substrate to determine defective circuits, predetermining a wavelength limit based upon absorption rate of fuse structures over the substrate, and burning at least one laser fuse to repair the defective circuits, wherein the substrate is shielded from lights having wavelengths substantially less than a predetermined lower limit.

In accordance with another aspect of the present invention, the wavelength limit is about 550 nm, and yellow light is used for lighting during the fuse burning process.

In accordance with yet another aspect of the present invention, the method includes providing a semiconductor wafer comprising integrated circuits, predetermining a wavelength limit based upon absorption rate of fuse structures on the semiconductor wafer, and transferring the wafer into a sub environment, such as a wafer container, which is substantially free from lights having wavelengths less than the wavelength limit.

In accordance with yet another aspect of the present invention, the wafer container is substantially opaque.

In accordance with yet another aspect of the present invention, containers for transporting the semiconductor wafers are purged with inert gases.

The preferred embodiments of the present invention significantly reduce the scrap rate of the wafers repaired by laser.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The fabrication of integrated circuits with redundant sub circuits typically includes the following steps. Integrated circuits are first fabricated on a semiconductor wafer. A quality assurance (QA) test, often referred to as a yield test, is then performed to determine the quality of the wafers. If defects are detected and determined to be fixable by replacing the defective portions with redundant sub circuits, a repairing process is performed by burning laser fuses. This causes the defective portions to be functionally disconnected and redundant sub circuits to be functionally connected. Another yield test will be performed, and the wafers are shipped for packaging.

Chemicals are used in the above-discussed fabrication processes, and residues of the potentially detrimental chemicals may remain. During the shipping of the semiconductor wafers, wafer containers may outgas, also producing detrimental chemical elements. After laser fuses are burned, the fuse windows are opened and burned fuse structures are exposed to external environments. The fabrication residues and outgassed chemicals corrode the exposed fuse structures, causing open circuits, short circuits, and/or an increase in the resistances of the interconnection structures.

The corrosion of the fuse is affected by various factors. To reduce corrosion, the mechanisms causing corrosion need to be scrutinized. Examining the possible factors has revealed that fluorine, chlorine and sulfur are among the possible chemicals causing the corrosion. Moisture has also been found to be an activator, accelerating the corrosion rate.

Further study has revealed that the corrosion process is related to the optical energy applied to the exposed fuse structures, and the greater the amount of optical energy applied, the faster the corrosion process is. The optical energy may be applied by exposing the fuse structures to light, including for example, general lighting. While the exact mechanism is not fully known or understood, the following discussion of one possible mechanism to explain surprising study results is provided.

Figure 1:
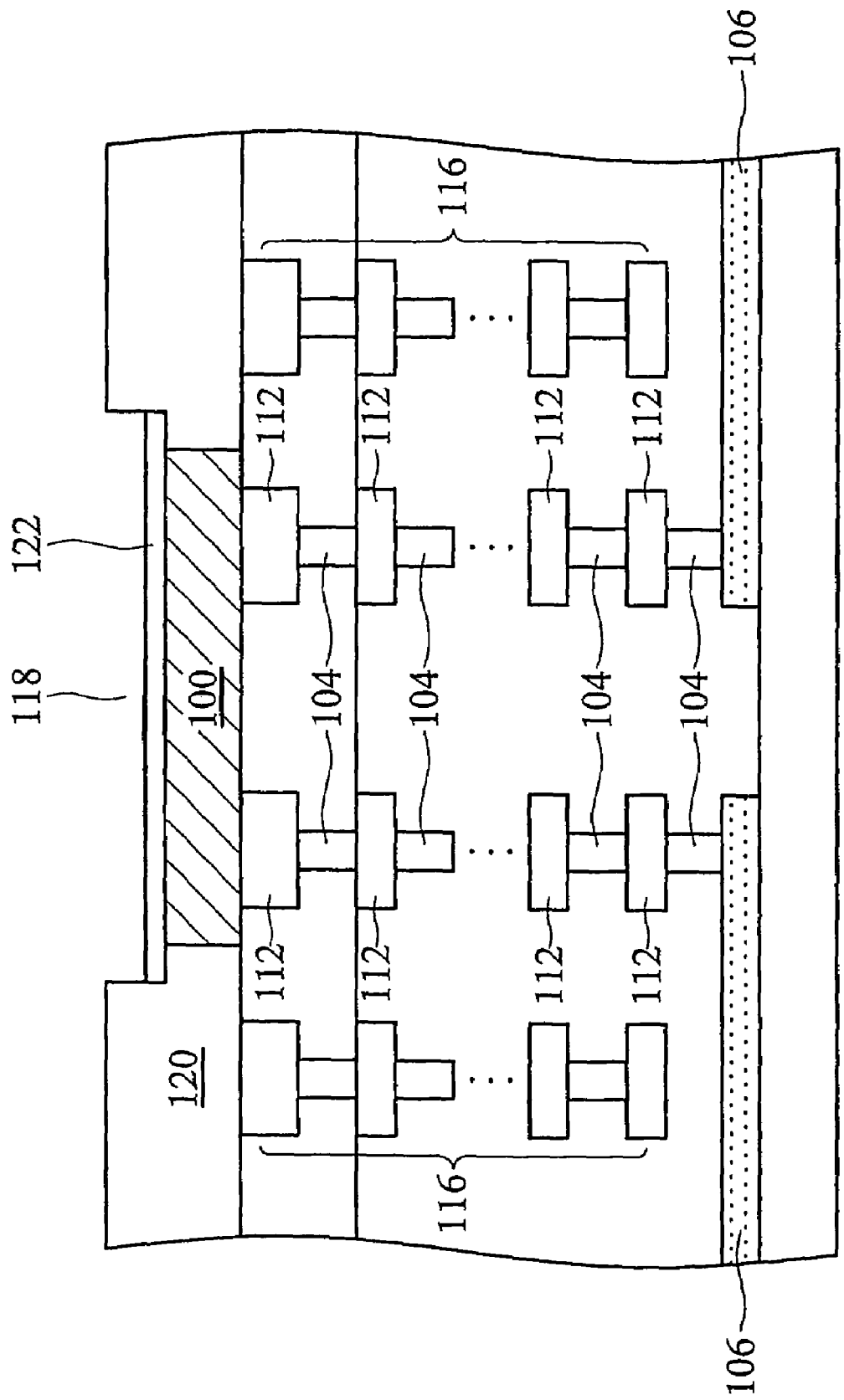
FIG. 1 illustrates a typical laser fuse structure.
Figure 2:
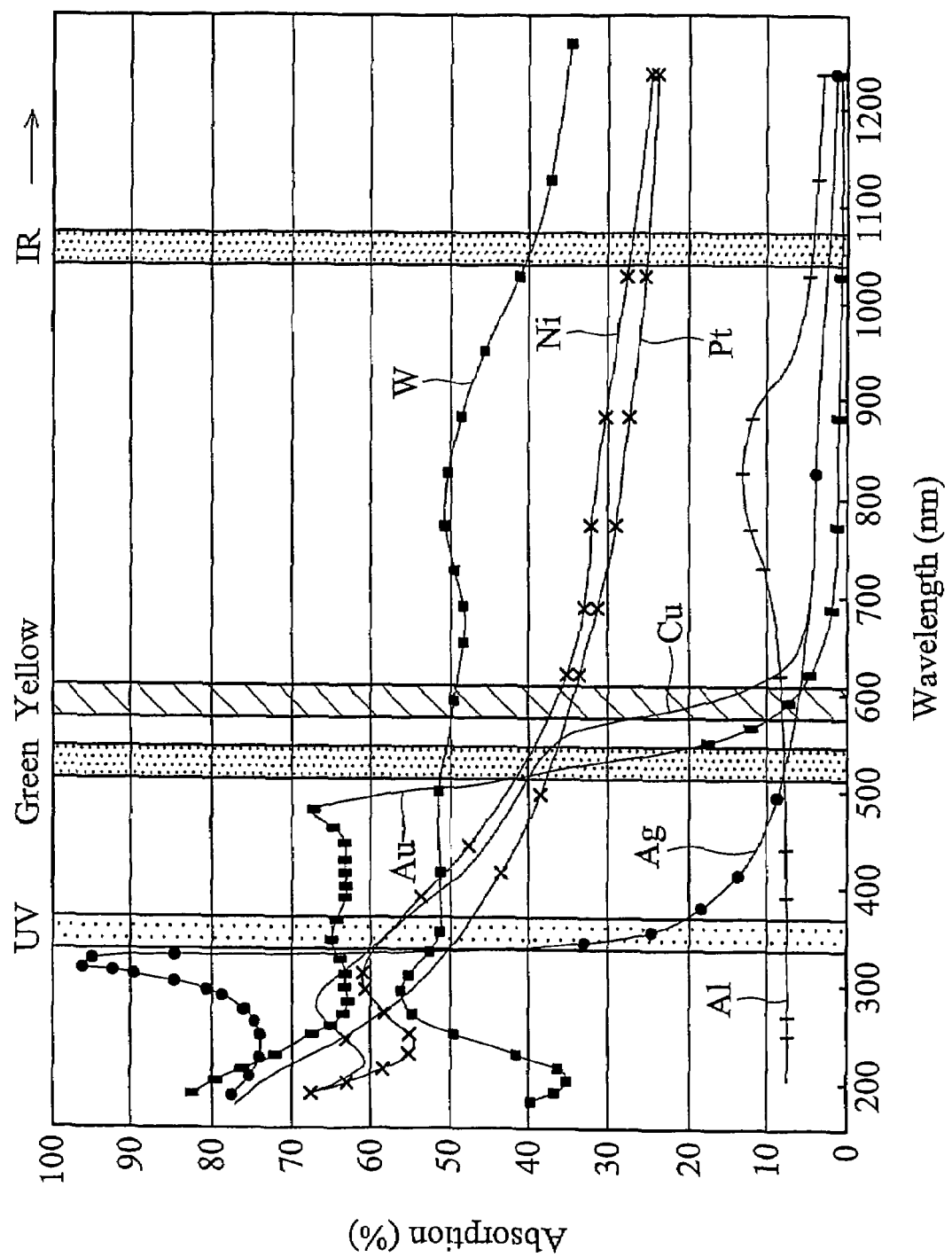
FIG. 2 illustrates absorption responses of metallic materials, wherein the absorption rates of the metallic materials are shown as the functions of wavelengths.

When a fuse structure is exposed to light, a portion of the light is reflected, and the rest is absorbed, thus a portion of the light energy is absorbed by the fuse structure. Different materials have different absorption responses to light. FIG. 2 illustrates absorption responses of certain metallic materials commonly used for fuse structures, including copper, platinum, nickel, gold, aluminum, tungsten and silver. The X-axis illustrates a wavelength range covering visible light, which extends from about 400 nm to about 700 nm. Ultra-violet (UV) light and infrared (IR) light, which have a shorter wavelength and a greater wavelength than visible light, respectively, are also illustrated. The Y-axis illustrates the absorption rate, which indicates the percentage of the light energy absorbed. It is noted that as a general trend, most of the materials have higher absorption rates at lower wavelengths (hence higher frequencies), and lower absorption rates at higher wavelengths (hence lower frequencies). Using copper as an example, in the ultra-violet light range, the absorption rate is between about 50 percent and about 60 percent, while in the yellow light range, which has a wavelength of between about 550 nm and about 600 nm, the absorption rate drops to about 20 percent. Further reduction of the wavelength of the light results in the further lowering of the absorption rate.

Another factor also plays a role in how the corrosion is affected by light. As is known in the electrical art, light energy is quantized and is related to the respective frequency or wavelength. The quantized energy, or energy of photons, can be expressed as $E=h\nu$, or $E=hc/\lambda$, wherein h is the Planck constant, c is the speed of light, $\nu$ is the frequency of the light and $\lambda$ is the wavelength of the light. An electron can be stimulated to a higher energy band by a photon having a quantized energy equal to or greater than the energy band differences. Reaction is more likely to occur when photons are in a higher energy band. This means that light having a higher frequency is more likely to activate corrosion.

Combining the absorption response and quantum effects, a conclusion can be drawn that in order to reduce the corrosion, less light energy and lights with greater wavelengths are preferable during the period of time when the fuse structures are exposed. The preferred embodiments of the present invention are thus provided conforming to the previously discussed findings.

Figure 3:
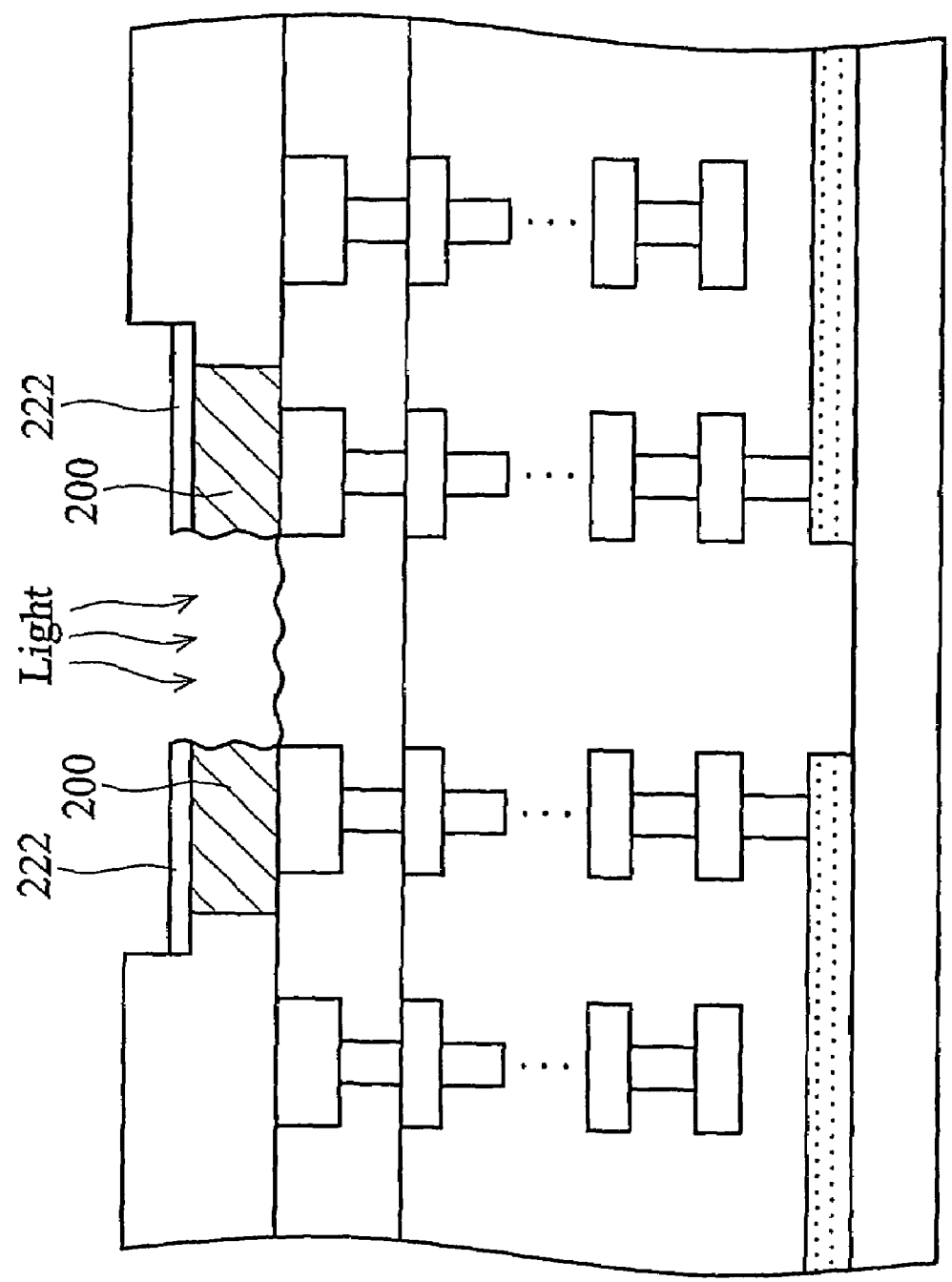
FIG. 3 illustrates a burned laser fuse exposed to light.

FIG. 3 illustrates a burned fuse structure comprising a fuse element 200. Preferably, a plurality of fuses is formed, and one or more fuses may be burned depending on the number of defective circuits. An energy source, preferably a laser, is used to burn the remaining passivation layer 222 and fuse element 200, thus replacing the defective circuit with a redundant circuit. As is known in the art, a chip typically includes a plurality of fuses connected to a plurality of redundant circuits, and only select fuses are burned as needed.

After the burning of laser fuses on wafers and before packaging, the wafers may be exposed to light on several occasions, for example, lighting needs to be provided for the burning process. In the preferred embodiment of the present invention, during this process, wafers are shielded from visible lights with wavelengths less than a lower limit, wherein the lower limit of the wavelength is affected by the materials used for forming the fuse structure. In an exemplary embodiment wherein copper is used in the fuse structures, the lower limit of the wavelength is preferably 550 nm or less. The lower limit can be determined using FIG. 2 as a reference, which shows that at wavelengths of greater than about 550 nm, the absorption rate of copper significantly drops. Therefore, it is preferred that during the laser burning process, the light used for lighting has a wavelength of greater than about 550 nm, and more preferably between about 550 nm and about 620 nm. Some other materials, such as gold and platinum, also show reduced absorption rates to light with wavelengths of 550 nm or greater, thus similar lighting can be used.

Light with a shorter wavelength is preferably filtered. This can be done by adding a filter that only allows low frequency light to pass, but filters high frequency light. In an exemplary embodiment, a filter made of glass or plastic having a red, orange or yellow color may filter lights with high frequency. Note that although some lights, such as ultra-violet light, are not visible to human eyes, they have a higher absorption rate and higher kinetic energy, thus are more preferably filtered. An extra step is preferred in order to measure the spectrum of the filtered light, ensuring that invisible high frequency light is filtered.

The determination of the lower limit of the light wavelength may be customized with respect to the materials used for forming the fuse structure. Generally, finding appropriate lights for lighting during the laser burning process includes determining materials of the fuse structures, measuring absorption responses of the materials, and determining a lower limit of the light wavelength. For example, if silver is used, since the absorption rate of silver significantly drops at a wavelength of 400 nm or higher, lights with wavelengths greater than about 400 nm can be used. This means that neo-white light can be used, while ultra-violet and violet lights need to be filtered.

Figure 4:
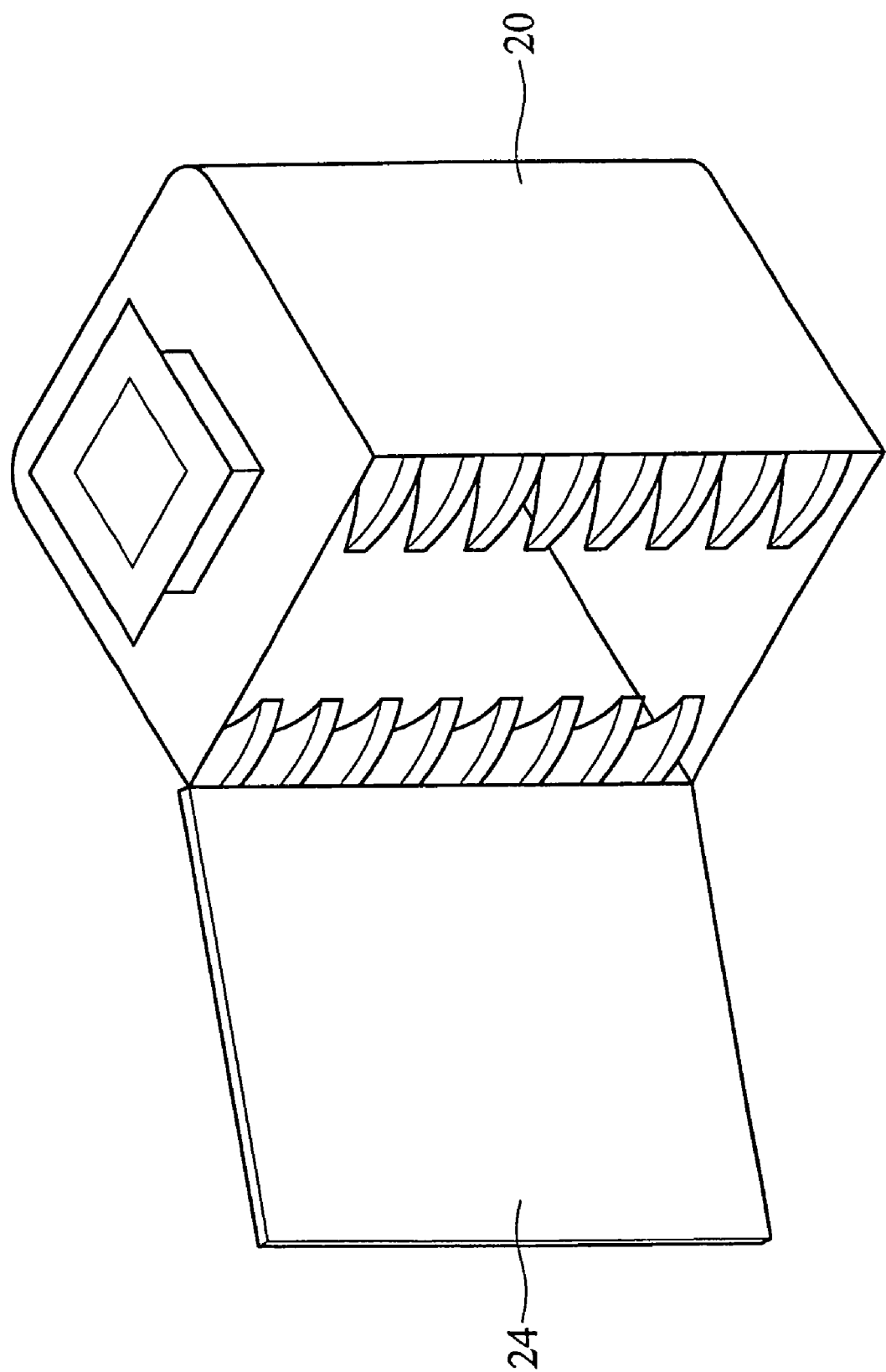
FIG. 4 schematically illustrates an exemplary front-opening shipping box.

After laser burning, wafers may go through a set of sub environments before they are finally packaged. The sub environments include, for example, testing environments and wafer containers specifically designed for transporting wafers. One of the commonly used wafer containers is a front-opening shipping box (FOSB). Throughout the description, FOSB is used to refer to a wafer container, although other types of wafer containers can also be used. FIG. 4 schematically illustrates a FOSB, which includes a pod case 20 comprising a plurality of shelves, each for holding one wafer, and a pod door 24. It is appreciated that a FOSB may comprise more components. However, throughout the description, the term "FOSB" is used to refer to the integrated component of pod case 20 and pod door 24.

Existing FOSBs are transparent, thus a wide spectrum of visible lights penetrates into the FOSBs and reaches the wafers. In the preferred embodiment, FOSBs are made of opaque materials. With the blocking of an opaque FOSB, visible light is substantially blocked. The internal illumination on the wafer surface is preferably less than about 50 Lux, and more preferably less than about 10 Lux, under normal lighting conditions. It is to be noted that the term "opaque" means that FOSBs preferably not only block visible light, but invisible light with short wavelengths also needs to be blocked. Particularly, lights with shorter wavelengths have a greater ability to penetrate than lights with longer wavelengths. Thus FOSBs that have the ability to block visible light do not necessarily have the ability to block lights with shorter wavelengths. Therefore, the blocking of lights with shorter wavelengths needs to be ensured.

In the preferred embodiment, FOSBs have at least a layer having a dark color, so that the external light is blocked.

In alternative embodiments, FOSBs filter lights with short wavelengths and allow in lights with greater wavelengths. Preferably, FOSBs will only allow in light with wavelengths greater than about 550 nm, and more preferably lights with wavelengths greater than about 620 nm. It is preferable to evaluate the materials for forming the fuse structures before an appropriate FOSB is selected.

As has been previously discussed, certain chemical elements such as fluorine, chlorine and sulfur corrode fuse structures. Additionally, FOSBs may outgas detrimental chemicals. Therefore, after the fuses are burned and the wafers are placed in FOSBs, and the FOSBs are preferably purged with an inert gas (or gases). The inert gases preferably include nitrogen, argon, helium and other gases that do not react with the fuse structures. The purpose of purging is to drive out detrimental chemicals and moisture. The FOSBs are then preferably sealed.

After the wafers are packaged in the FOSBs, further yield tests may be needed to ensure the quality of the repaired wafers, thus the FOSBs may need to be opened. Further purging of the FOSBs is thus preferred.

As moisture helps activate corrosion, reducing moisture will reduce the corrosion rate. Preferably, desiccant is placed between a FOSB and an electro-static discharge (ESD) bag, which encloses the FOSB and protects wafers from electrostatic discharge. This will reduce the moisture level during transportation of the wafers.

In the preferred embodiment, wafers are preferably shielded from light with short wavelengths during the period of time from laser burning to packaging. If any other processes, such as further yield tests, are involved, and wafers are to be taken out of the FOSBs, lighting with long wavelengths is preferred.

The preferred embodiments of the present invention have several advantageous features. The scrap rate of the laser-repaired wafers is significantly reduced to an unexpected level. Experiments performed on sample wafers have revealed that scrap rates are reduced from about 26 percent to about zero percent. This greatly increases production yield and reduces cost. A further advantageous feature of the preferred embodiments of the present invention is that no change to integrated circuit design is required for achieving such results.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing integrated circuits, the method comprising:
   providing a substrate comprising the integrated circuits;
   forming a plurality of fuses coupled to the integrated circuits;
   applying an energy source to burn at least one of the fuses; and
   shielding the substrate from exposure to substantially any light with a wavelength less than a predetermined lower limit after the burning of the at least one of the fuses.

2. The method of claim 1, wherein the predetermined lower limit is about 550 nm.

3. The method of claim 1, wherein the at least one of the fuses is burned under a light having a wavelength of between about 550 nm and about 620 nm.

4. The method of claim 1, wherein the step of shielding the substrate is performed during an entire period of time starting from the step of applying the energy source to burn the at least one of the fuses to a time the substrate is packaged.

5. The method of claim 1 further comprising transporting the substrate in a substantially opaque wafer container.

6. The method of claim 1 further comprising transporting the substrate in a wafer container, wherein the wafer container blocks light having wavelengths substantially less than the predetermined lower limit.

7. The method of claim 1, wherein the predetermined lower limit is determined based upon light absorption rates of the plurality of fuses.

8. The method of claim 1, wherein the step of shielding the substrate comprises transferring the semiconductor wafer into a sub environment, and wherein the sub environment blocks substantially all light having wavelengths less than the predetermined lower limit.

9. The method of claim 8 further comprising:
   performing a yield test on the substrate to determine defective circuits; and
   after the yield test and before the step of transferring the substrate into the sub environment, performing a fuse repairing process to repair the defective circuits.

10. The method of claim 8 further comprising purging the sub environment with an inert gas.

11. The method of claim 10, wherein the inert gas comprises nitrogen.

12. A method for manufacturing integrated circuits, the method comprising:

provm a semiconductor wafer comprising the integrated circuits;

performing a yield test on the semiconductor wafer to determine defective circuits in the integrated circuits;

transferring the wafer into a sub environment, wherein the sub environment allows light having wavelengths substantially greater than a predetermined wavelength limit to pass through, and wherein the sub environment blocks substantially all light having wavelengths less than the predetermined wavelength limit; and purging the sub environment with an inert gas after the wafer is transferred into the sub environment.

13. The method of claim 12, wherein the inert gas comprises nitrogen.

14. The method of claim 12 further comprising performing a fuse repairing process after the yield test to repair the defective circuits before the step of transferring the wafer into the sub environment.

15. A method for manufacturing integrated circuits, the method comprising:

providing a semiconductor wafer comprising the integrated circuits;

forming a plurality of fuses coupled to the integrated circuits;

applying an energy source to burn at least one of the plurality of fuses; and transferring the semiconductor wafer into a substantially opaque sub environment.

16. The method of claim 15, wherein the substantially opaque sub environment is a wafer container.

17. The method of claim 15, wherein, in the substantially opaque sub environment, a surface of the semiconductor wafer has an illumination of less than about 50 Lux.

18. The method of claim 17, wherein, in the substantially opaque sub environment, the surface of the semiconductor wafer has an illumination of less than about 10 Lux.

19. The method of claim 15, wherein the sub environment is a front-opening shipping box.

* * * * *